United States Patent
Eitler et al.

(10) Patent No.: US 12,235,312 B2
(45) Date of Patent: Feb. 25, 2025

(54) METHOD FOR CHECKING THE PLAUSIBILITY OF INSULATION MONITORING OF A HIGH-VOLTAGE SYSTEM OF AN ELECTRIC VEHICLE DURING THE CHARGING OF A TRACTION BATTERY OF THE ELECTRIC VEHICLE

(71) Applicant: Dr. Ing. h.c. F. Porsche Aktiengesellschaft, Stuttgart (DE)

(72) Inventors: Moritz Eitler, Stuttgart (DE); Oliver Lehmann, Leonberg (DE)

(73) Assignee: Dr. Ing. h. c. F. Porsche AG, Stuttgart (DE)

( * ) Notice: Subject to any disclaimer, the term of this patent is extended or adjusted under 35 U.S.C. 154(b) by 182 days.

(21) Appl. No.: 17/944,028

(22) Filed: Sep. 13, 2022

(65) Prior Publication Data
US 2023/0127297 A1    Apr. 27, 2023

(30) Foreign Application Priority Data
Oct. 21, 2021   (DE) ...................... 10 2021 127 385.4

(51) Int. Cl.
*G01R 31/00*    (2006.01)
*B60L 53/60*    (2019.01)
*G01R 31/14*    (2006.01)
*H02J 7/00*    (2006.01)

(52) U.S. Cl.
CPC .............. *G01R 31/14* (2013.01); *B60L 53/60* (2019.02); *G01R 31/006* (2013.01); *H02J 7/0047* (2013.01)

(58) Field of Classification Search
CPC ...... G01R 31/14; G01R 31/006; G01R 31/52; G01R 27/025; H02J 7/0047; B60L 53/60
See application file for complete search history.

(56) References Cited

U.S. PATENT DOCUMENTS

| | | | | |
|---|---|---|---|---|
| 5,351,041 A | * | 9/1994 | Ikata | H04L 12/40013 340/3.1 |
| 6,864,688 B2 | | 3/2005 | Beutelschiess et al. | |
| 2003/0214306 A1 | * | 11/2003 | Beutelschiess | B60L 58/34 324/511 |
| 2020/0110125 A1 | * | 4/2020 | Lehnhardt | G01R 31/1245 |
| 2022/0146561 A1 | * | 5/2022 | Ock | H01M 10/48 |

FOREIGN PATENT DOCUMENTS

| | | |
|---|---|---|
| DE | 102015016000 | 8/2016 |
| DE | 102016005732 | 11/2017 |
| DE | 102018116055 | 10/2019 |
| DE | 102019202892 | 9/2020 |
| DE | 102019109260 | 10/2020 |
| DE | 102019112839 | 10/2020 |

* cited by examiner

*Primary Examiner* — Lee E Rodak
*Assistant Examiner* — Demetrius R Pretlow
(74) *Attorney, Agent, or Firm* — Gerald E. Hespos; Michael J Porco

(57) ABSTRACT

A method is provided for checking the plausibility of insulation monitoring of a high-voltage system (100) of an electric vehicle during the charging of a traction battery of the electric vehicle. The electrical insulation of the high-voltage system (100) is monitored by an insulation monitoring device (101), and a check is carried out cyclically to determine whether a further insulation monitoring device is active on a high-voltage bus of the high-voltage system (100).

5 Claims, 1 Drawing Sheet

METHOD FOR CHECKING THE PLAUSIBILITY OF INSULATION MONITORING OF A HIGH-VOLTAGE SYSTEM OF AN ELECTRIC VEHICLE DURING THE CHARGING OF A TRACTION BATTERY OF THE ELECTRIC VEHICLE

CROSS-REFERENCE TO RELATED APPLICATION

This application claims priority on German Patent Application No 10 2021 127 385.4 filed Oct. 21, 2021, the entire disclosure of which is incorporated herein by reference.

BACKGROUND

Field of the Invention

This invention relates a method for monitoring the electrical insulation of a high-voltage system of an electric vehicle when charging a traction battery of the electric vehicle and to a method for checking the plausibility of results from insulation monitoring of the high-voltage system of the electric vehicle during the charging of a traction battery of the electric vehicle.

Related Art

An electric vehicle is connected galvanically to a DC charging apparatus when charging a traction battery of an electric vehicle with a DC current (DC charging). The high-voltage system of the electric vehicle usually is designed as a so-called IT system, with the abbreviation "IT" meaning "Isolé Terre" (French="insulated ground"). The "I" refers to a (PE-)insulated network, and the "T" refers to grounded consumers. This IT system is maintained during the charging process so that there is galvanic insulation to ground/earth.

Known systems continuously monitor the protective mechanism of the electrical insulation, i.e., very high insulation resistances against ground, by means of an insulation monitoring device. In some countries, in particular for DC charging, the electric vehicle itself is responsible for the insulation monitoring during the charging process.

U.S. Pat. No. 6,864,688 B2 discloses insulation monitoring of a DC network electrically insulated against the ground of a device. Two insulation monitoring devices monitor two different power supply units. The insulation monitoring devices alternately are connected to ground and disconnected from ground by a contactless switch. As a result, no interference of the measurement between the insulation monitoring devices can take place.

DE 10 2019 109 260 A1, DE 10 2019 112 839 B3, and DE 10 2018 116 055 B3 disclose various embodiments of insulation monitoring devices for monitoring insulation of electrical currents in an electric vehicle.

Numerous insulation monitoring devices are based on a so-called three-voltmeter method, which is a passive measurement method for alternately measuring potential differences between individual conductors. In the three-voltmeter method, three different potential differences are measured. Possible fault currents can be calculated from the measured values obtained in the process. For example, the potential differences +HV against ground, -HV against ground, and +HV against -HV are measured and evaluated using Kirchhoff's rules. Here, +HV is the potential applied to the positive pole of the traction battery and, correspondingly, -HV is the potential applied to the negative pole of the traction battery.

More particularly, DE 10 2018 116 055 B3 discloses a method for active insulation monitoring of a high-voltage system. The high-voltage system has a first line with a first voltage value +HV and a second line with a second voltage value -HV. A first potential difference between +HV and ground is formed, and a second potential difference between -HV and ground is formed. A first series circuit of a first semiconductor switch with a first resistance is arranged between +HV and ground, and a second series circuit of a second semiconductor switch with a second resistance is arranged between -HV and ground. A first and a second pulse width modulation are carried out on the two semiconductor switches. A first and a second pair of resistance values of the two series circuits are modulated by means of the respective pulse width modulations. A first voltage measurement is carried out for the first pair of resistance values, and a first pair of values is determined from the first and second potential differences. A second voltage measurement is carried out for the second pair of resistance values, and a second pair of values is determined from the first and second potential differences. A first insulation resistance of the first line and a second insulation resistance of the second line are calculated with the two pairs of values. Various system states thus are generated by the targeted use of switching elements (semiconductor switches) that are driven by pulse width modulation, and the two insulation resistances are calculated. Similar to the passive three-voltmeter method described above, in this active method, which also is referred to below as the active three-voltmeter method, the insulation resistances are calculated from the voltage measurements. The various system states can also, for example, be generated by a defined current injection instead of switching elements.

When multiple electric vehicles are connected to the charging apparatuses of a charging infrastructure, there is the problem that two or more insulation monitoring devices activated at the same time may affect one another and thus may lead to an erroneous detection of insulation faults. Furthermore, ground interference couplings may also affect the three-voltmeter method and may lead to erroneously reported insulation faults. Incorrectly detected insulation faults lead to termination of the charging process and thereby result in interoperability issues.

The invention has the object of providing a method for checking the plausibility of insulation monitoring of a high-voltage system of an electric vehicle during the charging of a traction battery of the electric vehicle, where method easily and effectively prevents erroneous detections of insulation faults.

SUMMARY

A method according to the invention for checking the plausibility of insulation monitoring of a high-voltage system of an electric vehicle during the charging of a traction battery of the electric vehicle is characterized in that a check is carried out cyclically so as to check whether a further insulation monitoring device is active on a high-voltage bus of the high-voltage system. It can thereby be determined in a very simple manner whether or not the cause of an insulation fault detected by the insulation monitoring device is a further insulation monitoring device that is likewise active on the high-voltage bus of the high-voltage system. The method according to the invention thus makes it possible to easily and effectively prevent erroneous detections of insulation faults. Charging interruptions can thus be avoided so that improved charging availability is achieved.

An active portion, formed by switching elements, such as semiconductor switches, or current injection means of the insulation monitoring device is deactivated in each checking cycle for a defined plausibility-check time within which a check is carried out as to whether a further insulation monitoring device is active on the high-voltage bus of the high-voltage system.

The insulation monitoring device of some embodiments is configured such that the following applies: (insulation monitoring device initiation time–plausibility check time)>insulation resistance determination time.

The duration of the initiation time can be selected to be 30 s to 150 s, preferably 60 s to 120 s.

In some embodiments, three different potential differences are measured by the insulation monitoring device using a three-voltmeter method and insulation resistances of the high-voltage system are calculated therefrom. As a result, insulation monitoring can take place in a very simple manner.

In some embodiments, the three potential differences continue to be measured after deactivating the active portion of the insulation monitoring device. By measuring the three potential differences and evaluating the measured data obtained in the process, it can be determined in a suitable manner whether or not a further insulation monitoring device is active on the high-voltage bus of the relevant high-voltage system. In the process, it is checked whether the three measured potential differences have a low-frequency, cyclic pattern. If so, this means that a further insulation monitoring device is active on the high-voltage bus of the relevant high-voltage system.

Further features and advantages of the present invention become apparent from the following description of a preferred exemplary embodiment with reference to the appended illustrations.

DETAILED DESCRIPTION

Figure 1:
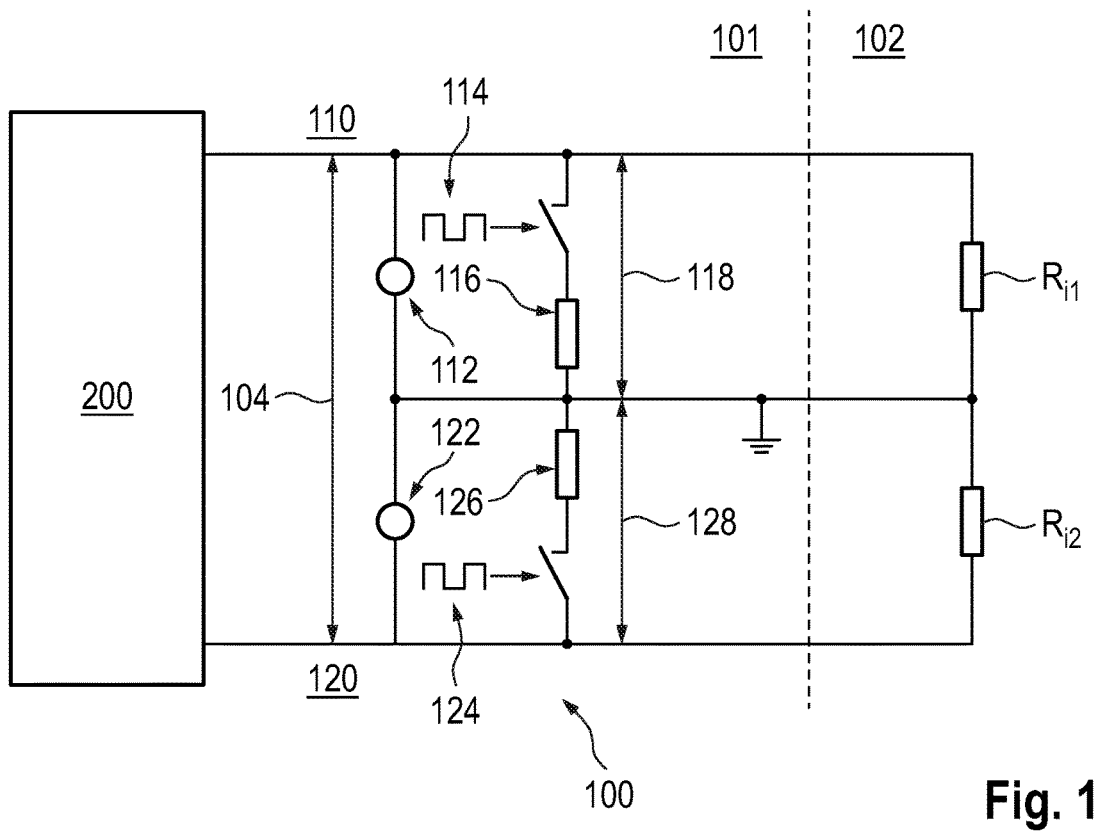
FIG. 1 is a schematic representation of a circuit diagram of a high-voltage system with an insulation monitoring device.

FIG. 1 shows a circuit diagram of a high-voltage system 100 of an electric vehicle connected to a DC voltage charging apparatus 200 that enables a traction battery of the electric vehicle to be charged. The DC voltage charging apparatus 200 is part of a charging infrastructure comprising plural corresponding DC voltage charging apparatuses so that the traction batteries of plural electric vehicles can be charged simultaneously.

Galvanic insulation of the electric vehicle against ground is provided during charging. This insulation is monitored by an insulation monitoring device 101 of the high-voltage system 100, as described in detail below. The basic construction and operation of the insulation monitoring device 101 are known from DE 10 2018 116 055 B3.

After the traction battery of the electric vehicle has been connected to the DC voltage charging apparatus 200, a terminal voltage 104 (U1=UHV) is applied to the poles of the traction battery. A first pole of the traction battery has a first voltage value 110 (+HV), and a second pole of the traction battery has a second voltage value 120 (−HV). A first potential difference 118 results from a difference between the first voltage value 110 (+HV) and a ground potential, and a second potential difference 128 results from a difference between the ground potential and the second voltage value 120 (−HV).

The insulation monitoring device 101 carries out active insulation monitoring of the high-voltage system 100 and comprises a first voltage measuring apparatus 112, a second voltage measuring apparatus 122, a first series circuit with a first resistor 116 and a first semiconductor switch driven with a first pulse width modulation signal 114, as well as a second series circuit with a second resistor 126 and a second semiconductor switch driven with a second pulse width modulation signal 124. By modulating the respective pulse width modulation 114 and 124, an active symmetrization function ensures that the two potential differences 118 and 128 match and the following applies to the voltage values: U2=UHV/2 and U3=UHV/2. The potential curves then also apply to the portion 102 of the high-voltage system 100 shown on the right side in FIG. 1.

Pulse width modulation modulates a duty cycle of a respective rectangular pulse at constant frequency. With this respective rectangular pulse (pulse width modulation signal 114, 124), the respective semiconductor switch, which opens or closes, depending on the type, for a duration of the rectangular pulse so that various states of the high-voltage system 100 can be generated in this way. A variation in the respective duty cycle thus results in a variation in the respective resistance value of the respective series circuit and thus also in the respective potential difference determined by the respective voltage measurement. Similar to a three-voltmeter method, the insulation resistances then are calculated from the voltage measurements.

The first resistance value of the first series circuit is referred to as RS1, the second resistance value of the second series circuit is referred to as RS2, the first insulation resistance is referred to as Ri1, the second insulation resistance is referred to as Ri2, the first potential difference is referred to as V1, and the second potential difference is referred to as V2.

The following relationship results from the application of Kirchhoff's rules: $V1/R1s+V1/R1i=V2/R2s+V2/R2i$. The insulation resistances Ri1 and Ri2 can be obtained from the above equation by measuring the voltages of the potential differences twice. The pairs of values {V1(1), V2(1)} and {V1(2), V2(2)} are measured at various resistance values {RS1(1), RS2(1)} and {RS1(2), RS2(2)} respectively caused by pulse width modulation. The respective resistance value of a respective series circuit that results during the respective PWM of the respective semiconductor switch is determined in advance of carrying out the method.

When multiple electric vehicles are connected to the charging apparatuses of the charging infrastructure, there is the problem that two or more insulation monitoring devices 101 activated at the same time may affect one another and thus lead to an erroneous detection of insulation faults. Furthermore, ground interference couplings may also affect the above-described active three-voltmeter method for determining the insulation resistances Ri1 and Ri2 and may lead to erroneously reported insulation faults. Incorrectly detected insulation faults lead to termination of the charging process and thereby result in interoperability issues.

Figure 2:
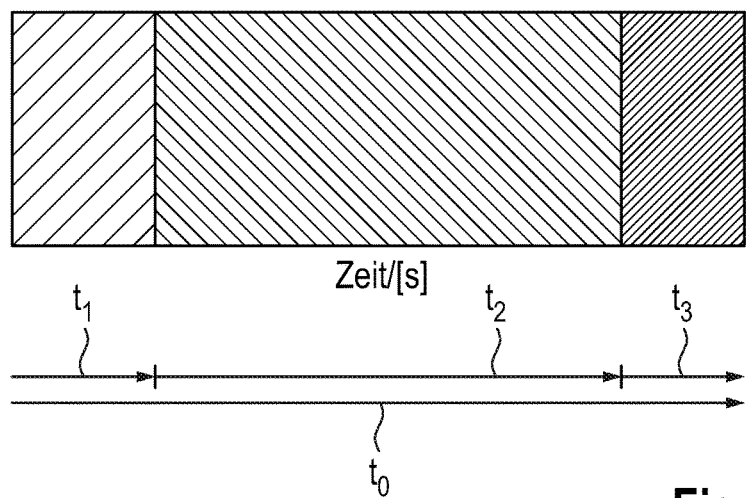
FIG. 2 is a schematic representation illustrating a time sequence of insulation monitoring of the high-voltage system.

To remedy this problem, a check is carried out cyclically as to whether a further insulation monitoring device is active on the high-voltage bus of the high-voltage system 100 in addition to the insulation monitoring device 101. Thus, a determination can be made in a very simple manner as to whether or not the cause of an insulation fault detected by the insulation monitoring device 101 is a further insulation monitoring device that is active on the high-voltage bus of the high-voltage system 100. In the process, the active portion, formed in the present case by semiconductor switches, of the insulation monitoring device 100 is deactivated in each checking cycle for a defined plausibility-check time within which a check is carried out as to whether a further insulation monitoring device is active on the high-voltage bus of the high-voltage system 100. A corresponding time sequence is shown in FIG. 2. This results in: (insulation monitoring device initiation time t0–plausibility check time t1)>insulation resistance determination time t2. In FIG. 2, t3 denotes the response time to insulation monitoring. Preferably, the duration of the initiation time t0 can be selected to be 30 s to 150 s, preferably 60 s to 120 s.

The three potential differences continue to be measured after deactivating the active portion of the insulation monitoring device 101. By evaluating the measured data obtained in the process, it can be determined in a suitable manner whether a further insulation monitoring device is active on the high-voltage bus of the relevant high-voltage system 100. In the process, it is checked whether the three measured potential differences have a low-frequency, cyclic pattern. If so, this means that a further insulation monitoring device is active on the high-voltage bus of the relevant high-voltage system 100.

The method presented here thus makes it possible to easily and effectively prevent erroneous detections of insulation faults. Charging interruptions can thus be avoided so that improved charging availability is also achieved overall.

The invention claimed is:

1. A method for checking a plausibility of an insulation fault indication when monitoring a high-voltage system (100) of an electric vehicle when charging a traction battery of the electric vehicle at a DC voltage charging apparatus (200) capable of simultaneously charging traction batteries of other electric vehicles, the method comprising: connecting the traction battery of the electric vehicle to the DC charging apparatus (200); using an insulation monitoring device (101) on the electric vehicle to carry out a three volt-meter method for measuring three different potential differences to monitor electrical insulation of the high-voltage system (100); cyclically deactivating an active portion of the insulation monitoring device (101) of the electric vehicle; using the insulation monitoring device (101) of the electric vehicle while the active portion of the insulation monitoring device is deactivated; and continuing charging the traction battery of the electric vehicle if the three different potential differences measured by the insulation monitoring device (101) of the electric vehicle identify a cyclic pattern thereby indicating that an insulation monitoring device of a further electric vehicle is active on the DC charging device (200).

2. The method of claim 1, wherein the active portion of the insulation monitoring device (101) comprises switching elements.

3. The method of claim 2, wherein an insulation monitoring device initiation time minus a plausibility check time is greater than an insulation resistance determination time.

4. The method of claim 3, wherein a duration of the initiation time is selected to be 30 s to 150 s.

5. The method of claim 1, wherein the charging of the traction battery of the electric vehicle is continued if the three different potential differences measured by the insulation monitoring device (101) of the electric vehicle while the active portion of the insulation monitoring device is deactivated identify three measured potential differences that have a low-frequency, cyclic pattern.

* * * * *